United States Patent
Chen et al.

(10) Patent No.: US 9,312,214 B2
(45) Date of Patent: Apr. 12, 2016

(54) SEMICONDUCTOR PACKAGES HAVING POLYMER-CONTAINING SUBSTRATES AND METHODS OF FORMING SAME

(75) Inventors: Meng-Tse Chen, Changzhi Township (TW); Chih-Wei Lin, Xinfeng Township (TW); Chun-Cheng Lin, New Taipei (TW); Wen-Hsiung Lu, Jhonghe (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 237 days.

(21) Appl. No.: 13/240,629

(22) Filed: Sep. 22, 2011

(65) Prior Publication Data
US 2013/0075921 A1 Mar. 28, 2013

(51) Int. Cl.
| | | |
|---|---|---|
| H01L 23/498 | (2006.01) |
| H01L 21/60 | (2006.01) |
| H01L 21/50 | (2006.01) |
| H01L 21/56 | (2006.01) |
| H01L 21/48 | (2006.01) |
| H01L 21/683 | (2006.01) |
| H01L 23/00 | (2006.01) |

(52) U.S. Cl.
CPC ........ H01L 23/49816 (2013.01); H01L 21/486 (2013.01); H01L 21/563 (2013.01); H01L 21/6835 (2013.01); H01L 23/49827 (2013.01); H01L 23/49894 (2013.01); H01L 24/16 (2013.01); H01L 2221/68345 (2013.01); H01L 2224/131 (2013.01); H01L 2224/13082 (2013.01); H01L 2224/13147 (2013.01); H01L 2224/13155 (2013.01); H01L 2224/13164 (2013.01); H01L 2224/16237 (2013.01); H01L 2224/32225 (2013.01); H01L 2224/73204 (2013.01); H01L 2924/12042 (2013.01); H01L 2924/15331 (2013.01)

(58) Field of Classification Search
CPC ........ H01L 21/50; H01L 23/498; H01L 21/60
USPC .......... 257/774, 773, 734, 735, 736; 438/112, 438/124
See application file for complete search history.

(56) References Cited

U.S. PATENT DOCUMENTS

| 7,642,128 B1 * | 1/2010 | Lin et al. ........................ 438/106 |
| 7,776,655 B2 * | 8/2010 | Do et al. ........................ 438/113 |

(Continued)

OTHER PUBLICATIONS

Yoon, S.W., et al., "Development of Super Thin TSV PoP," 2011 Electronic Components and Technology Conference, IEEE, pp. 274-278.

(Continued)

Primary Examiner — Evan Pert
Assistant Examiner — Damon Hillman
(74) Attorney, Agent, or Firm — Slater & Matsil, L.L.P.

(57) ABSTRACT

A method includes applying a polymer-comprising material over a carrier, and forming a via over the carrier. The via is located inside the polymer-comprising material, and substantially penetrates through the polymer-comprising material. A first redistribution line is formed on a first side of the polymer-comprising material. A second redistribution line is formed on a second side of the polymer-comprising material opposite to the first side. The first redistribution line is electrically coupled to the second redistribution line through the via.

20 Claims, 5 Drawing Sheets

(56) References Cited

U.S. PATENT DOCUMENTS

| | | | |
|---|---|---|---|
| 7,993,972 B2* | 8/2011 | Lin et al. | 438/109 |
| 8,304,915 B2* | 11/2012 | Mori et al. | 257/774 |
| 8,564,119 B2* | 10/2013 | Eichelberger et al. | 257/706 |
| 2007/0284694 A1* | 12/2007 | Geiss et al. | 257/565 |
| 2008/0157316 A1* | 7/2008 | Yang | 257/685 |
| 2010/0013081 A1* | 1/2010 | Toh et al. | 257/692 |
| 2011/0121445 A1* | 5/2011 | Mori et al. | 257/693 |
| 2011/0156269 A1* | 6/2011 | Nam et al. | 257/774 |
| 2011/0215470 A1* | 9/2011 | Chen et al. | 257/738 |
| 2011/0241222 A1* | 10/2011 | Sezi et al. | 257/782 |
| 2012/0049332 A1* | 3/2012 | Chen et al. | 257/632 |

OTHER PUBLICATIONS www.statschippac.com, "fcPoP Flip Chip Package-on-Package: fcVFBGA-PoPb, fcWFBGA-PoPb," Mar. 2010, 2 pgs.

www.statschippac.com, "PoP Package-on-Package: VFBGA-PoPb-SDx, L/TFBGA-PoPt-SDx," Mar. 2010, 2 pgs.

Smith, L.J., www.semiconductor.net/packaging, "Package-on-Package: The Story Behind This Industry Hit," 6 pgs.

www.amkor.com, "TMV™ PoP Thru-Mold Via Package on Package," 1 pg.

* cited by examiner

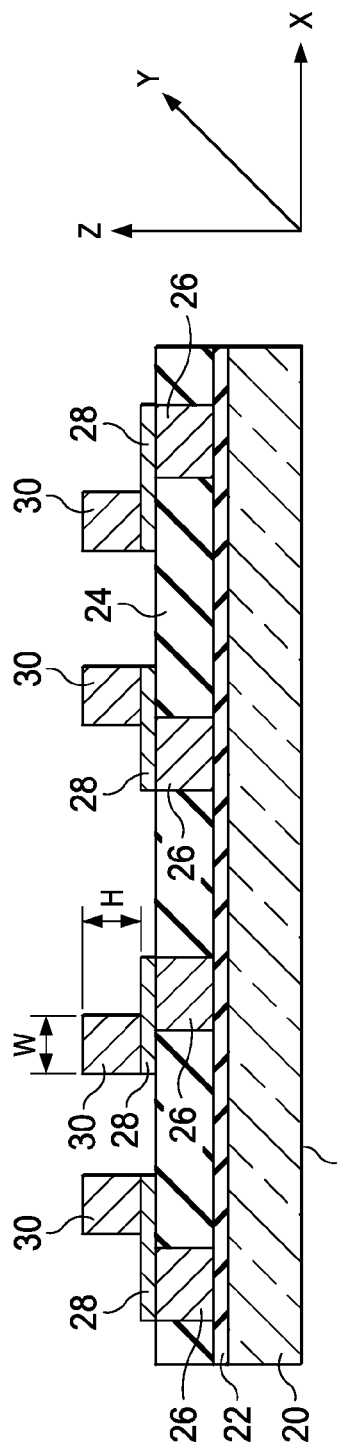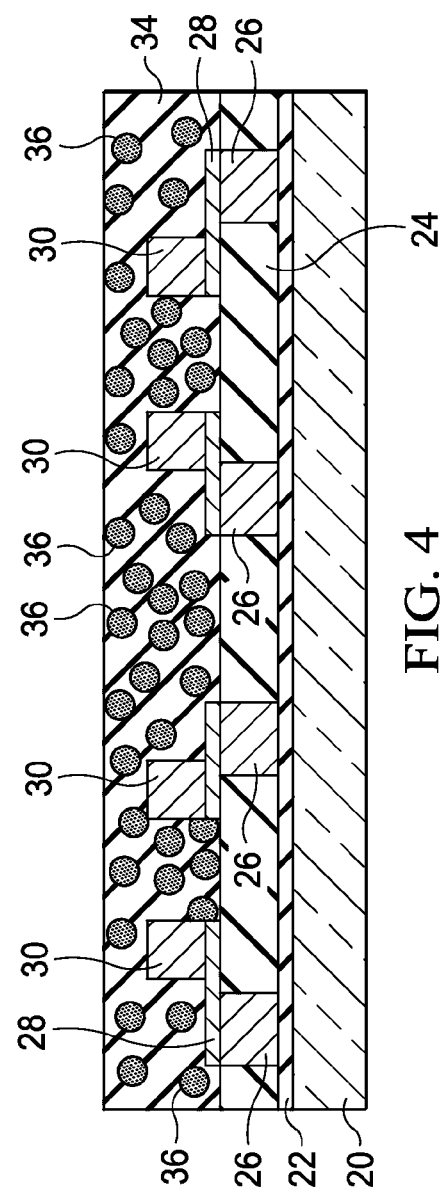

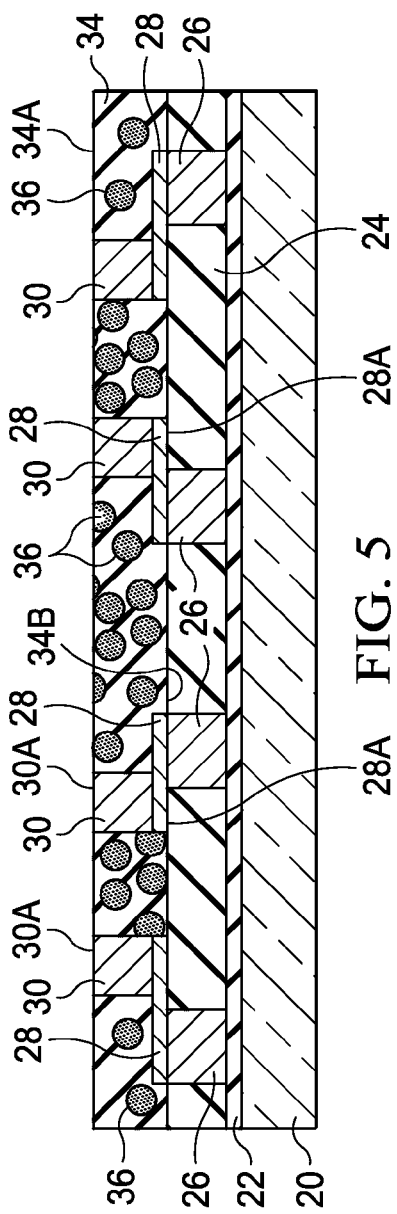
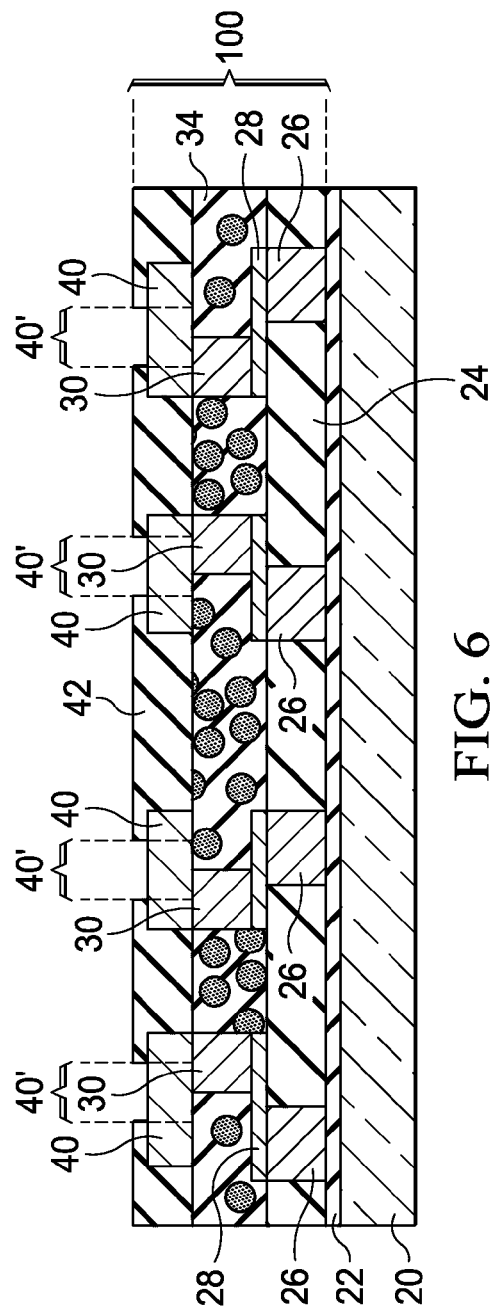

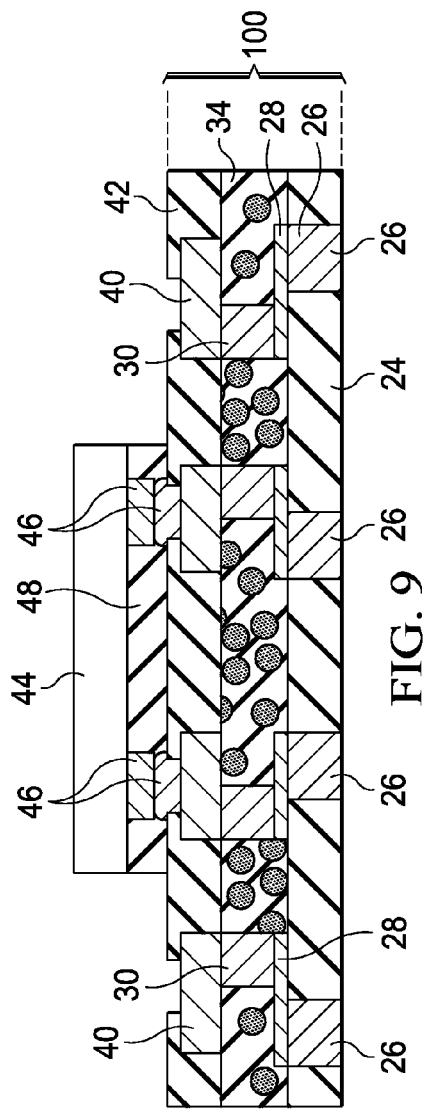
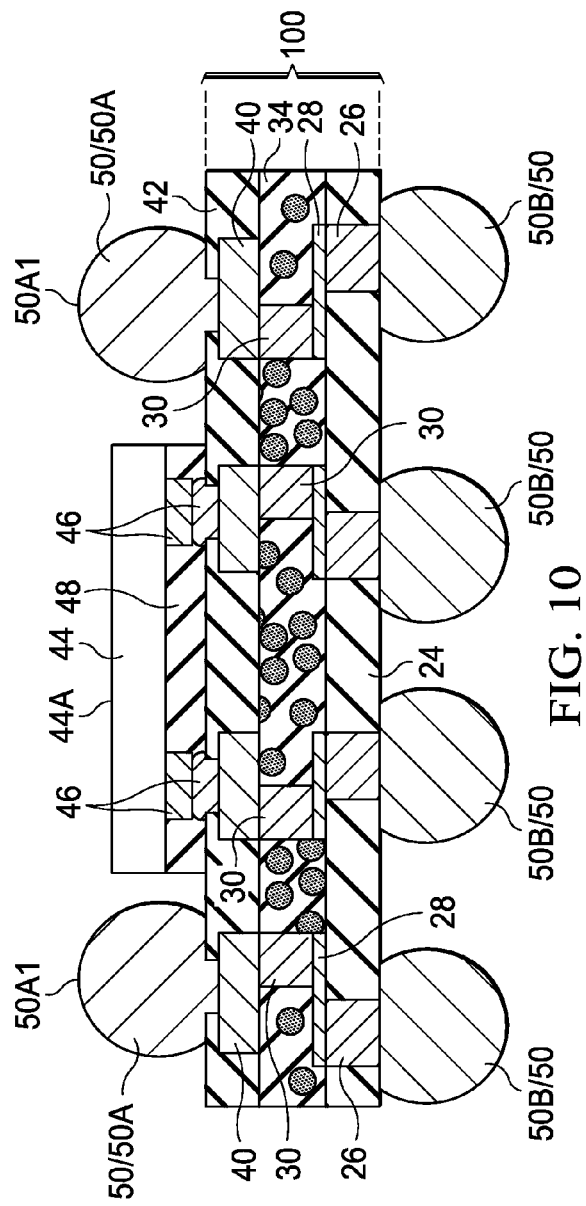

SEMICONDUCTOR PACKAGES HAVING POLYMER-CONTAINING SUBSTRATES AND METHODS OF FORMING SAME

BACKGROUND

The fabrication of modern circuits typically involves several steps. Integrated circuits are first fabricated on a semiconductor wafer, which contains multiple duplicated semiconductor chips, each comprising integrated circuits. The semiconductor chips are then sawed from the wafer and packaged. The packaging processes have two main purposes: to protect delicate semiconductor chips, and to connect interior integrated circuits to exterior pins.

In conventional packaging processes, a semiconductor chip may be mounted on a package component using flip-chip bonding. An Underfill is dispensed into the gap between the semiconductor chip and the package component to prevent cracks from being formed in solder bumps or solder balls, wherein cracks are typically caused by thermal stresses. The package component may be an interposer that includes metal connections for routing electrical signals between opposite sides. The chip may be bonded to the interposer through direct metal bonding, solder bonding, or the like.

With the increasing demand for more functions, system-in-package (SiP) technology, in which two or more chips are packaged on one module substrate, has increasingly been used. Furthermore, package-on-package (PoP) technology is also used to further expand the integration ability of the packages. When the PoP technology is used, packages are stacked. With a high degree of integration, the electrical performance of the resulting package is improved due to the shortened connecting path between components. By using SiP and/or PoP technologies, package design becomes more flexible and less complex. Time-to-market is also reduced for product upgrades.

With the increase in the size of the package, greater stresses are introduced. Furthermore, the non-uniformity in the stress distribution inside packages becomes more severe. Due to the greater stresses in local regions, packages are more prone to failures. Possible failures in a package include bump cracking, substrate cracking, low-k material or underfill delaminating, BGA ball cracking, etc. Efforts have been taken to solve these problems by using interposers based on organic substrates, which are formed of fiber-filled cores and build-up layers. The use of the interposers that have organic substrates, however, still cannot eliminate some of the problems since the coefficients of thermal expansion (CTEs) of the organic substrates are significantly higher than the CTE of silicon substrates. On the other hand, although the silicon substrates in the interposers have the same CTE as the CTE of the substrates in the device dies, the manufacturing cost of the interposers based on the silicon substrates is high.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 10 are cross-sectional views of intermediate stages in the manufacturing of a package in accordance with various embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package and the method of forming the same are provided in accordance with various embodiments. The intermediate stages of forming the package are illustrated. The variations of the embodiments are discussed. Throughout the various views and illustrative embodiments, like reference numbers are used to designate like elements.

Figure 1:
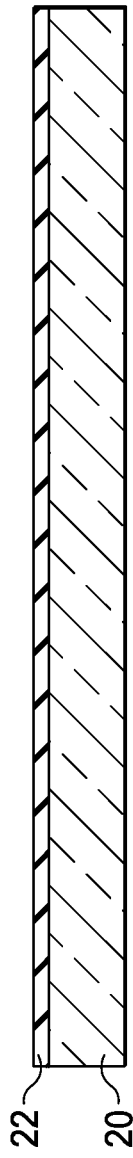

FIGS. 1 through 10 illustrate the cross-sectional views of intermediate stages in the manufacturing of a package in accordance with embodiments. FIG. 1 illustrates carrier 20 and release layer 22 formed on carrier 20. Carrier 20 may be a glass carrier, a ceramic carrier, or the like. Release layer 22 may be formed of a polymer-based material, which is capable of being removed later, so that the structures formed over release layer 22 may be demounted from carrier 20. In an embodiment, release layer 22 is formed of an epoxy-based thermal-release material such as Teflon, wax, acrylic resin, or the like. In some embodiments, release layer 22 is dispensed as a liquid, and is then cured. The top surface of release layer 22 is leveled to have a high degree of co-planarity. In alternative embodiments, release layer 22 is a laminate film, and is laminated onto carrier 20.

Figure 2:
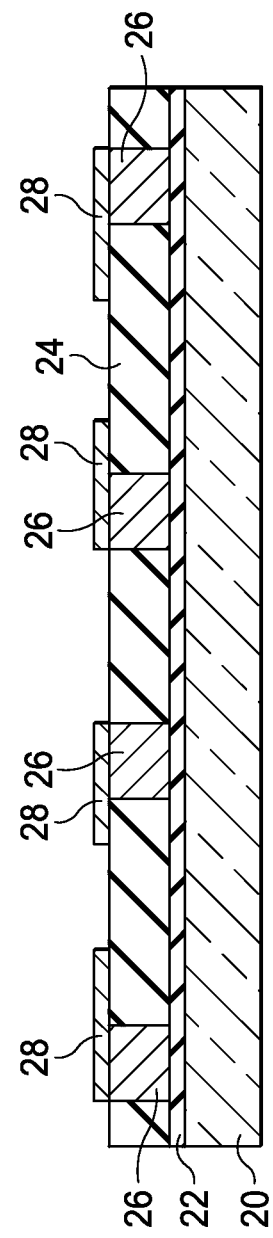

Next, as shown in FIG. 2, dielectric layer 24 is formed, and redistribution lines (RDLs) 26 are formed in dielectric layer 24. Dielectric layer 24 is alternatively referred to as inter-layer dielectric (ILD) 24 hereinafter. The bottom surface of ILD 24 may be in contact with the top surface of release layer 22. In an embodiment, ILD 24 is formed of a photo-sensitive material such as polybenzoxazole (PBO), polyimide, or the like. Alternatively, ILD 24 is formed of a nitride such as silicon nitride. In alternative embodiments, ILD 24 may be formed of an oxide such as silicon oxide, phosphosilicate glass (PSG), borosilicate glass (BSG), boron-doped phosphosilicate glass (BPSG), or the like. RDLs 26 may include narrow portions and wider portions, wherein the wide portions may act as bond pads in subsequent bonding processes. In accordance with some exemplary embodiments, the formation of RDLs 26 and ILD 24 may include a damascene process, which includes forming ILD 24 as a blank layer, forming openings in ILD 24, filling a metallic material in ILD 24, and performing a chemical mechanical polish (CMP).

RDLs 28 are formed over ILD 24 and RDLs 26. RDLs 26 and 28 may be formed of copper, aluminum, tungsten, or the like. The formation methods of RDLs 28 may include plating, deposition and patterning, and the like. In some embodiments, RDLs 28 and RDLs 26 may be formed in a same process step, for example, using plating. In an exemplary embodiment the formation of RDLs 28 (and possibly RDLs 26) including forming and patterning a photo-sensitive material, and plating the RDLs 28 in the openings in the photo-sensitive material. The photo-sensitive material is later-on removed. It is appreciated that additional RDL layers (not shown) may be stacked between, and electrically coupled between, RDLs 28 and RDLs 26.

FIG. 3 illustrates the formation of Z-interconnects 30, which may have height H (in the Z-direction) that is greater than the horizontal dimensions (W). The horizontal dimensions W may be measured in the X or Y directions parallel to major surface 20A of carrier 20. Z-interconnects 30 are electrically coupled to, and may be in physical contact with, RDLs 26. The longitudinal direction of Z-interconnects 30 is in the Z direction, which is perpendicular to major surface 20A of carrier 20. In an embodiment, height H of Z-interconnects 30 is greater than about 10 µm, or greater than about 200 µm. The formation process of Z-interconnects 30 may include forming a photo-sensitive material (not shown) over RDLs 26 and ILD 24, performing a lithography process to form openings (not shown) in the photo-sensitive material, and plating a metallic material into the openings. After removing the photo-sensitive material, the plated metallic material forms Z-interconnects 30.

Next, as shown in FIG. 4, polymer-comprising material 34 is applied on the structure shown in FIG. 3. Polymer-comprising material 34 may be dispensed in a liquid form, so that Z-interconnects 30 are submerged in polymer-comprising material 34. The polymer in polymer-comprising material 34 may be selected from an underfill, a molding compound, a molding underfill (MUF), or an epoxy. Polymer-comprising material 34, however, may be free from fibers therein. A curing step is then performed to solidify polymer-comprising material 34. In an embodiment, polymer-comprising material 34 comprises silicon filler 36 therein, which may be a powder of silicon comprising silicon grains. By adding silicon filler 36, the coefficient of thermal expansion (CTE) of polymer-comprising material 34 may be reduced due to the fact that the CTE of silicon filler 36 has substantially the same CTE as silicon, which is lower than the CTE of the polymer in polymer-comprising material 34. Silicon filler 36 may be pre-mixed into polymer-comprising material 34 before polymer-comprising material 34 is dispensed. The CTE of the resulting polymer-comprising material 34 may be between about 3 and about 30.

Referring to FIG. 5, a grinding is performed to level the top surfaces 30A of Z-interconnects 30 and the top surface 34A of polymer-comprising material 34. In the structure shown in FIG. 5, polymer-comprising material 34 acts as the substrate of the resulting interposer 100 (please refer to FIG. 6), while Z-interconnects 30 acts as the through-substrate vias (TSVs, or through-vias) in the substrate. In accordance with the formation processes adopted in the exemplary embodiments, bottom surfaces 28A of RDLs 28 maybe level with bottom surface 34B of polymer-comprising material 34.

In some embodiments as shown in FIGS. 3 through 5, Z-interconnects 30 are formed before the formation of polymer-comprising material 34. In alternative embodiments, polymer-comprising material 34 may be formed before the formation of Z-interconnects 30. The forming process may comprise applying and curing the polymer-comprising material 34, etching or drilling openings in the polymer-comprising material 34 to expose portions of RDLs 28, and filling the openings with a metallic material to form Z-interconnects 30. A grinding may further be performed to level the top surfaces of polymer-comprising material 34 and the resulting Z-interconnects 30.

In FIG. 6, additional RDLs and ILDs are formed over polymer-comprising material 34 and Z-interconnects 30. The additional RDLs are electrically coupled to Z-interconnects 30. For example, in the illustrated embodiments, RDLs 40 are formed in ILD 42, and are electrically coupled to, and possibly in contact with, Z-interconnects 30. The material and the formation method of RDLs 40 may be essentially the same as that of the respective RDLs 26 or 28, although different materials and formation methods may be used. Also, the material and the formation method of ILD 42 may be essentially the same as that of ILD 24, although different materials and formation methods may be used. Although one layer of RDLs 40 and one layer of ILD 42 are shown, more layers may be formed and stacked on the illustrated RDLs 40 and ILD 42. ILD 42 may have openings, through which top surfaces of RDLs 40 are exposed. The exposed portions of RDLs 40 may act as bond pads, which are also referred to as bond pads 40'. Bond pads 40' may further include an additional protective layer(s) (not shown) such as a nickel layer, a palladium layer, a gold layer, or the like. Throughout the description, the structure shown in FIG. 6, excluding release layer 22 and carrier 20, is referred to as interposer 100, which includes no active devices such as transistors therein. In addition, interposer 100 may comprise no passive devices such as resistors, capacitors, inductors, or the like, although the passive devices may be formed in interposer 100 in accordance with alternative embodiments.

Figure 7:
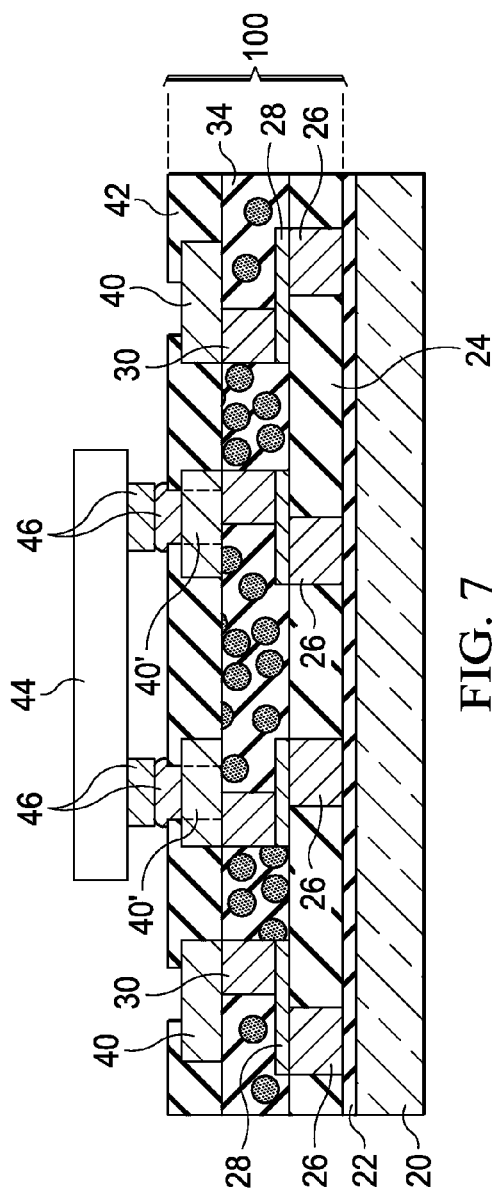

In FIG. 7, die 44 is bonded to bond pads 40'. Die 44 may be a device die comprising active devices (not shown) such as transistors therein. Alternatively, die 44 may be a package that comprises a device die, an interposer, a package substrate, and/or the like therein. Although one die 44 is illustrated, a plurality of dies 44, which may be identical to each other or different from each other, may be bonded to interposer 100. The bonding may be a flip-chip bonding, which is performed through electrical connectors 46 that interconnect RDLs 40 to the devices in die 44. Electrical connectors 46 may have various forms. In some embodiments, electrical connectors 46 are solder balls. In alternative embodiments, electrical connectors 46 may include copper pillars, solder caps, nickel layers, palladium layers, and/or the like.

Figure 8:
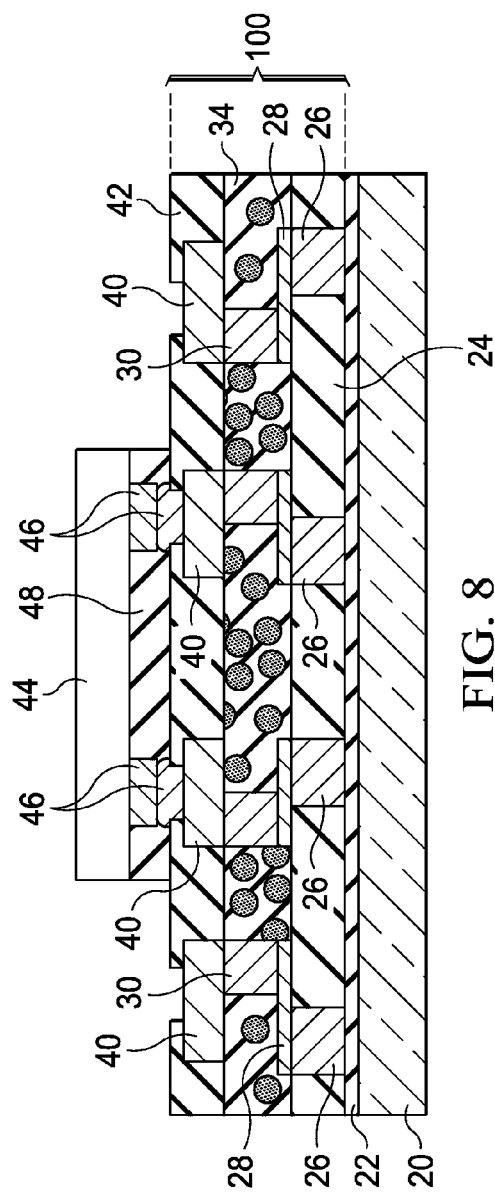

FIG. 8 illustrates the filling and the curing of underfill 48, which is dispensed into the gap between interposer 100 and die 44. After the dispensing, underfill 48 is cured. Next, as shown in FIG. 9, carrier 20 is demounted from interposer 100, which may be achieved by removing release layer 22 or performing a step to cause release layer 22 to lose adhesion. In the exemplary embodiment wherein release layer 22 is formed of an epoxy-based thermal-release material, the demounting may be performed by chemical solvent dissociation, laser ablation, UV releasing, or mechanical peeling.

FIG. 10 illustrates the ball-mounting process, wherein solder balls 50 are mounted on the surfaces of interposer 100. Solder balls 50 also act as the electrical connectors for bonding and electrically coupling additional package components (not shown) to interposer 100. Solder balls 50 may include solder balls 50A that are on the same side of interposer 100 as die 44, and solder balls 50B that are on the opposite side of interposer 100 than die 44. Solder balls 50A may have top ends 50A1 higher than top surface 44A of die 44. Accordingly, an additional package component (not shown) may be bonded to solder balls 50A, while die 44 may be located between interposer 100 and the additional package component.

In the embodiments, by forming polymer-comprising material 34 as the substrate of interposer 100 (FIG. 10), the CTE of the substrate of interposer 100 may be adjusted to close to the CTE of silicon, so that a smaller stress may be generated when die 44 is bonded to interposer 100 during the thermal cycles. In accordance with embodiments, the CTE of polymer-comprising material 34 may be adjusted by adding low-CTE materials such as silicon filler into a polymer-comprising material.

In accordance with embodiments, a method includes applying a polymer-comprising material over a carrier, curing the polymer-comprising material to solidify the polymer-comprising material, and forming a through-via over the carrier. The through-via is located inside the polymer-comprising material, and substantially penetrates through the polymer-comprising material. A first redistribution line is formed on a first side of the polymer-comprising material. A second redistribution line is formed on a second side of the polymer-comprising material opposite to the first side. The first redistribution line is electrically coupled to the second redistribution line through the through-via.

In accordance with other embodiments, a method includes forming a first dielectric layer over a release layer, which is further located over a carrier, forming a first plurality of RDLs in the first dielectric layer; and forming a plurality of metal features over and electrically coupled to the first plurality of RDLs. A polymer-comprising material is dispensed over the first dielectric layer, wherein the plurality of metal features is submerged in the polymer-comprising material. A curing step is performed on the polymer-comprising material to solidify the polymer-comprising material. A grinding is performed to level top surfaces of the plurality of metal features and a top surface of the polymer-comprising material. A second plurality of RDLs is formed over and electrically coupled to the plurality of metal features.

In accordance with yet other embodiments, a device includes a first plurality of RDLs, a plurality of through-vias over and connected to the first plurality of RDLs, and a substrate including a polymer-comprising material. The first plurality of RDLs and the plurality of through-vias are in the polymer-comprising material. A bottom surface of the polymer-comprising material is leveled with bottom surfaces of the first plurality of RDLs. Top surfaces of the through-vias are level with a top surface of the polymer-comprising material. A second plurality of RDLs is disposed over the substrate and electrically coupled to the first plurality of RDLs through the plurality of through-vias.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a first dielectric layer over a carrier, wherein no conductive features are attached to the carrier prior to forming the first dielectric layer;
    after forming the first dielectric layer, forming a first redistribution line extending through the first dielectric layer;
    applying a polymer-comprising material over the first dielectric layer and the carrier;
    forming a via over the carrier, wherein the via is located inside the polymer-comprising material, and substantially penetrates through the polymer-comprising material;
    forming a second redistribution line in a second dielectric layer over the polymer-comprising material and the carrier, and wherein the first redistribution line is electrically coupled to the second redistribution line through the via; and
    forming a third redistribution line over and electrically coupled to the first redistribution line, wherein the third redistribution line is located inside in the polymer-comprising material, and wherein a bottom surface of the third redistribution line is level with a bottom surface of the polymer-comprising material.

2. The method of claim 1, wherein the step of forming the polymer-comprising material and the step of forming the via comprise:
    forming the via electrically coupled to the first redistribution line;
    after the step of forming the via, performing the step of applying the polymer-comprising material, wherein the polymer-comprising material is applied in a liquid form, and wherein the via is submerged in the polymer-comprising material; and
    curing the polymer-comprising material, and performing a grinding to level a top surface of the via with a top surface of the polymer-comprising material.

3. The method of claim 1 further comprising pre-mixing silicon filler into the polymer-comprising material before the step of applying the polymer-comprising material over the carrier.

4. The method of claim 1, wherein the first redistribution line and the first dielectric layer is formed over and contacting a release layer, wherein the release layer is over a carrier, wherein forming the first redistribution line comprises:
    forming an opening extending through the first dielectric layer exposing the release layer; and
    forming the first redistribution line in the opening.

5. The method of claim 4 further comprising demounting the carrier from the first redistribution line by removing the release layer.

6. The method of claim 5 further comprising, after the step of removing the release layer, attaching a solder ball to the first redistribution line.

7. The method of claim 1, wherein the polymer-comprising material comprises a material selected from the group consisting essentially of an underfill, a molding compound, and a molding underfill.

8. A method comprising:
    forming a first dielectric layer over a release layer, wherein the release layer is further located over a carrier;
    forming a first plurality of redistribution lines (RDLs) in the first dielectric layer using a damascene process, wherein the damascene process comprises:
        forming an opening through the first dielectric layer to expose the release layer; and
        filling the opening with a conductive material;
    forming a plurality of metal features over and electrically coupled to the first plurality of RDLs;
    forming a polymer-comprising material over the first dielectric layer, wherein the plurality of metal features is submerged in the polymer-comprising material;
    curing the polymer-comprising material to solidify the polymer-comprising material;
    performing a grinding to level top surfaces of the plurality of metal features and a top surface of the polymer-comprising material; and
    forming a second plurality of RDLs over and electrically coupled to the plurality of metal features using a damascene process.

9. The method of claim 8 further comprising, after the step of forming the second plurality of RDLs, demounting the carrier from the first plurality of RDLs.

10. The method of claim 9 further comprising, after the step of demounting, attaching a plurality of solder balls to the first plurality of RDLs.

11. The method of claim 8 further comprising:
bonding a die over the second plurality of RDLs; and
attaching a plurality of solder balls to the second plurality of RDLs, wherein the plurality of solder balls are adjacent to the die.

12. The method of claim 8 further comprising, before the step of forming the polymer-comprising material over the carrier, pre-mixing a silicon filler into the polymer-comprising material.

13. The method of claim 8, wherein the polymer-comprising material comprises a material selected from the group consisting essentially of an underfill, a molding compound, and a molding underfill.

14. A method comprising:
forming a first redistribution line over a carrier;
forming a polymer comprising material over the first redistribution line, wherein the polymer comprising material comprises silicon filler and a metal feature;
forming a second redistribution line over the polymer comprising material, wherein the second redistribution line is electrically connected to the first redistribution line through the metal feature;
forming a third redistribution line over and electrically coupled to the first redistribution line, wherein after the step of forming the polymer comprising material, the third redistribution line is submerged in the polymer comprising material, and wherein a bottom surface of the third redistribution line is level with a bottom surface of the polymer comprising material;
bonding a die to the second redistribution line; and
forming a solder ball adjacent the die and disposed on a fourth redistribution line, wherein top and bottom surfaces of the second and fourth redistribution lines are substantially level, and wherein the solder ball is at least as tall as the die.

15. The method of claim 14, wherein forming the polymer comprising material over the first redistribution line comprises:
forming a metal feature over the first redistribution line;
dispensing the polymer comprising material in a liquid form over the first redistribution line and submerging the metal feature;
curing the polymer comprising material to solidify the polymer comprising material; and
grinding a top surface of the polymer comprising material so that the top surface is level with a top surface of the metal feature.

16. The method of claim 14, wherein forming the polymer comprising material over the first redistribution line comprises:
applying the polymer comprising material over the first redistribution line in a liquid form;
curing the polymer comprising material to solidify the polymer comprising material;
forming an opening in the polymer comprising material, exposing the first redistribution line; and
filling the opening with a metallic material to form the metal feature.

17. The method of claim 14, wherein the silicon filler is a powder of silicon comprising silicon grains.

18. The method of claim 14, wherein the silicon filler is pre-mixed in the polymer comprising material before forming the polymer comprising material over the first redistribution line.

19. The method of claim 14, wherein forming the first and second redistribution lines comprises forming the first redistribution line and the second redistribution line in a first dielectric layer and a second dielectric layer, respectively.

20. The method of claim 14, wherein the polymer comprising material is substantially free of any active devices.

* * * * *